United States Patent [19]

Hummel et al.

[11] Patent Number: 5,597,621
[45] Date of Patent: Jan. 28, 1997

[54] METHOD OF MANUFACTURING PHOTOLUMINESCING SEMICONDUCTOR MATERIAL USING LASERS

[75] Inventors: Rolf E. Hummel; Matthias H. Ludwig; Martin Vala, all of Gainesville, Fla.

[73] Assignee: University of Florida, Gainesville, Fla.

[21] Appl. No.: 566,088

[22] Filed: Dec. 1, 1995

[51] Int. Cl.$^6$ ........................................................ B05D 3/06
[52] U.S. Cl. ........................................... 427/554; 427/596
[58] Field of Search .......................... 427/553, 554, 427/596; 156/643.1; 148/33.4

[56] References Cited

U.S. PATENT DOCUMENTS 5,397,429  3/1995  Hummel et al. ................... 156/643
5,421,958  6/1995  Fathaner et al. ..................... 216/48

OTHER PUBLICATIONS

Laiho et al, Phys. Rev. B, vol. 51, No. 20, 15 May 1995, pp. 14774–14777.

Movtchan et al, Thin Solid Films 255(1995) pp. 286–289.

Primary Examiner—Roy V. King
Attorney, Agent, or Firm—Thomas C. Saitta

[57] ABSTRACT

A method for the manufacture of a photoluminescing layer on a normally non-photoluminescing semiconductor substrate, such as a porous silicon layer created on a silicon substrate, by treating the surface of the substrate with a relatively high energy, pulsed laser beam.

10 Claims, No Drawings

METHOD OF MANUFACTURING PHOTOLUMINESCING SEMICONDUCTOR MATERIAL USING LASERS

BACKGROUND OF THE INVENTION

This invention was made with government support under grant/contract DMR 9415358 awarded by the National Science Foundation. The government has certain rights in the invention.

This invention relates generally to the field of techniques for manufacturing semiconductor substrates which are photoluminescing. More particularly, the invention relates to the manufacture of photoluminescing semiconductor materials, and in particular photoluminescing porous silicon, using laser treatment.

Silicon is widely used in the manufacture of microelectronic devices, but conventionally produced silicon and other semiconductor materials are not suitable for light emitting diodes or lasers since they do not photoluminesce. It has recently been discovered that essentially porous silicon is photoluminescing and can therefore be utilized for light emitting devices. Porous silicon is generally characterized as an array of free-standing, crystalline silicon columns ranging from 2 to 100 nanometers in diameter with a large surface-to-volume ratio. Pore size and pore density vary.

It is well known to create porous silicon by anodic etching of a silicon wafer in aqueous acid solutions, such as a solution containing hydrofluoric acid. Thin layers of porous silicon 3 to 7 microns in depth are produced this way near the surface of the silicon wafer. Examples of such techniques are given in Kinney et al., U.S. Pat. No. 4,532,700 and Katoh et al., U.S. Pat. No. 5,156,896. This method of creating photoluminescing porous silicon creates problems for research and large scale production, since the process introduces various contaminants onto the surface of the silicon. Additionally, the process is environmentally detrimental because of the hazardous etching solutions required.

A non-etching method for production of photoluminescing porous silicon is disclosed in Hummel. et al., U.S. Pat. No. 5,397,429. This method involves the use of spark processing to create a porous surface on the silicon wafer. While successful in producing photoluminescing silicon, the process involves generating high voltage sparks which cannot always be controlled in a precise manner, making the process less suitable for use in precision situations. The technique cannot be used in situations where the high voltage and lateral extension of the sparking could damage other structures on the silicon substrate, such as on a computer chip already containing electronic circuitry.

It is an object of this invention to provide a method for producing photoluminescing porous silicon (n-type, p-type or undoped) or other semiconductor-type material which does not require nor utilize electrochemical etching in aqueous acid solutions and which can be controlled with some degree of precision to prevent extraneous damage during processing. It is an object to provide such a process which utilizes laser energy to produce the photoluminescing porous surface layer on the silicon substrate.

SUMMARY OF THE INVENTION

A photoluminescing porous silicon layer is produced by exposing a silicon or other semiconductor material wafer substrate to pulsed high energy from a laser to create local flash evaporation, which results in the formation of nanometer scale, structured material after ablation, cooling and redeposition. The silicon substrate is exposed to pulsed laser radiation from a laser, such as for example a NdYAG laser or $CO_2$ laser operating at approximately 532 nanometers, at approximately 10 millijoules with a beam diameter of from about 3 millimeters down to a focused beam of about 1 millimeter or less, for a period of from 2 to 20 minutes. The laser beam is pulsed in approximately 1 to 20 nanosecond bursts at a frequency of from 1 to 100 hertz. The laser beam can be scanned across the surface of the silicon substrate, and the radiation intensity and the spot size can be adjusted for specific circumstances. The impact of the laser energy is confined to a relatively shallow surface area, protecting any buried or embedded electronic structures in the silicon wafer. The process can be performed in various atmospheres.

DETAILED DESCRIPTION OF THE INVENTION

The invention comprises a method of creating a photoluminescing porous layer on the surface of a silicon or other semiconductor substrate by exposing the substrate to a pulsed, high energy laser beam. Silicon and other semiconductor materials are normally non-photoluminescing, but can be made to be optically active in the visible spectral range by this methodology. Localized flash evaporation occurs on the surface of the silicon substrate due to the high energy of the laser beam, which is rapidly pulsed for an extended time period. The resulting cooling and redeposition of the silicon material results in a photoluminescing layer having microstructures on a nanometer scale.

A laser capable of delivering energy in pulses, such as for example a NdYAG laser or $CO_2$ laser operating at a wavelength of 532 nanometers, is provided to treat the substrate surface. The laser beam is operated at a relatively high energy of approximately 10 millijoules. Pulse duration is set for between approximately 1 to 20 nanoseconds, preferably at approximately 10 nanoseconds, and the laser beam is pulsed at a frequency of between approximately 1 to 100 Hertz, preferably at approximately 10 Hertz. The beam diameter is focused to approximately 3 millimeters or less. The substrate is treated for from 2 to 20 minutes, resulting in the production of a porous photoluminescing layer on the surface of the silicon substrate. The process can be performed in atmosphere or under controlled conditions with particular gas atmospheres.

The true scope and definition of the invention is to be as set forth in the following claims.

We claim:

1. A method for the manufacture of a photoluminescing porous surface layer on a semiconductor substrate comprising the steps of providing a laser capable of delivering a pulsed laser beam and exposing the surface of the semiconductor substrate to said pulsed laser beam, where said beam has an energy of approximately 10 millijoules, is pulsed at a frequency from approximately 1 to 100 hertz with pulse duration between approximately 1 and 20 nanoseconds, is focused to a beam diameter of up to 3 millimeters, and for a period of time of 2 to 20 minutes.

2. The method of claim 1, wherein said laser beam is produced at a wavelength of approximately 532 nanometers.

3. The method of claim 1, wherein said laser is a NdYAG laser.

4. The method of claim 1, wherein said laser is a $CO_2$ laser.

5. The method of claim 1, wherein said surface is exposed in atmosphere.

6. A method for the manufacture of a photoluminescing porous silicon layer on a silicon substrate comprising the steps of providing a laser capable of delivering a pulsed laser beam and exposing the surface of the silicon substrate to said pulsed laser beam, where said beam has an energy of approximately 10 millijoules, is pulsed at a frequency from approximately 1 to 100 hertz with pulse duration between approximately 1 and 20 nanoseconds, is focused to a beam diameter of up to 3 millimeters, and for a period of from 2 to 20 minutes.

7. The method of claim 6, wherein said laser beam is produced at a wavelength of approximately 532 nanometers.

8. The method of claim 6, wherein said laser is a NdYAG laser.

9. The method of claim 6, wherein said laser is a $CO_2$ laser.

10. The method of claim 6, wherein said surface is exposed in atmosphere.

* * * * *